United States Patent [19]

Hughes et al.

[11] 4,241,165
[45] Dec. 23, 1980

[54] PLASMA DEVELOPMENT PROCESS FOR PHOTORESIST

[75] Inventors: Henry G. Hughes, Phoenix; Jed V. Keller, Mesa, both of Ariz.

[73] Assignee: Motorola, Inc., Schaumburg, Ill.

[21] Appl. No.: 939,586

[22] Filed: Sep. 5, 1978

Related U.S. Application Data

[63] Continuation of Ser. No. 811,493, Jun. 30, 1977, which is a continuation-in-part of Ser. No. 784,102, Apr. 4, 1977, which is a continuation-in-part of Ser. No. 697,303, Jun. 17, 1976.

[51] Int. Cl.³ .............................................. G03C 5/24
[52] U.S. Cl. ................................. 430/269; 156/643; 156/644; 430/312; 430/313; 430/314; 430/300; 430/306; 430/325; 430/326; 430/329; 430/330; 430/435
[58] Field of Search ................ 96/35.1, 36, 36.2, 363; 156/646, 643; 134/22, 19; 430/313, 314, 312, 434, 435, 300, 306, 325, 326, 329, 401

[56] References Cited

U.S. PATENT DOCUMENTS

| | | | |
|---|---|---|---|
| 3,705,055 | 12/1972 | Christensen et al. | 156/646 X |
| 3,920,483 | 11/1975 | Johnson, Jr. et al. | 156/643 |
| 3,997,367 | 12/1976 | Yau | 156/646 X |
| 4,056,395 | 11/1977 | Sato et al. | 156/643 |

OTHER PUBLICATIONS

Hollohan et al., Techniques and Applications of Plasma Chemistry, Wiley & Sons, (1975), pp. 350–355.

*Primary Examiner*—John D. Welsh
*Attorney, Agent, or Firm*—Foorman L. Mueller; Vincent J. Rauner

[57] ABSTRACT

After exposure to radiation photoresist may be developed by a dry process using a gas plasma, preferably an oxygen plasma. The process can be used for chemical milling, photolithography, printed circuit board and photomask manufacture and it is particularly advantageous in the manufacture of semiconductors. The plasma development process can be followed by plasma etch and strip processes without requiring removal of the work piece from the plasma reactor.

26 Claims, 3 Drawing Figures

20.
A. PREHEAT REACTOR TO PREDETERMINED TEMPERATURE.
B. LOAD WAFER.
C. SET REACTOR PRESSURE RF FORWARD POWER.
D. INITIATE PLASMA AT PREDETERMINED PRESSURE.
E. STOP PLASMA AT SELECTED ENDPOINT.

PLASMA DEVELOPMENT PROCESS FOR PHOTORESIST

BACKGROUND OF THE INVENTION

This is a continuation of continuation-in-part application Ser. No. 811,493 filed June 30, 1977, a continuation-in-part of continuation-in-part application Ser. No. 784,102 filed Apr. 4, 1977, and a continuation-in-part of application Ser. No. 697,303, filed June 17, 1976.

This invention relates to a photoresist development process and more particularly, to a dry photoresist development process for the semiconductor industry.

During the manufacturing process for semiconductors several photoresist steps are utilized to perform the various manufacturing steps to evolve the device or integrated circuit. For example, in the manufacture of a typical bipolar integrated circuit as many as seven photoresist steps may be utilized to: put in (1) the buried layer; (2) the junction isolation; (3) the base diffusion; (4) the emitter diffusion; (5) the collector enhancement diffusion; (6) the metallization openings; and (7) the metallization patterning. If a multilevel metallization system is utilized further photoresist steps are required. Each of the photoresist steps requires development and hard bake which for the customary wet processing requires approximately thirty minutes for one wafer. Also, after each photoresist hard bake step the semiconductor wafer undergoes a combination of sequential processing operations which involve dissimilar chemical systems. More specifically, the semiconductor wafer undergoes a wet etch after which either a wet or a plasma stripper is employed to remove the patterned photoresist. Thus, the present processing of semiconductors in this manner involves a considerable amount of labor and time. Therefore, there is an extreme need in the semiconductor industry for photoresist development, etch and strip processes which are faster than the present wet chemical systems.

Also, wet processes for photoresist development, etch and strip tend to be expensive, cause air pollution and can be hazardous to health. More particularly, some wet developers for photoresist include xylene which is a petrochemical material that is known to be hazardous to health and to contribute to air pollution. More specifically, excessive exposure to xylene is known to cause liver damage in humans and because xylene is an unsaturated material it is photoreactive and, therefore, undesirably contributes to haze, smog and air pollution problems. Also, the cost of xylene is directly related to oil costs and, consequently, economic projections indicate that this material will become more and more expensive to purchase. Thus, there is a need for a photoresist development process which is less expensive, less polluting and less hazardous to health than the wet chemical systems presently being utilized.

In accordance with prior art such as Berridge et al, IBM Disclosure Bulletin, Volume 10, No. 8, January, 1969, page 1260, an oxygen plasma may be used to strip residual photoresist material from a semiconductor wafer following the processing utilizing that particular photoresist mask. Thus, there is taught in the prior art that a photoresist material can be cleaned from a semiconductor wafer by exposure to plasma but there is no suggestion of selective removal by plasma between the exposed and unexposed photoresist material as has been discovered in accordance with the present invention.

Other industries using large quantities of wet developed photoresist are, for example, the printing, photographic, copying, printed circuit board, photomask and chemical milling industries. In all of these and similar industries the use of a dry development process would be highly advantageous because of the aforementioned disadvantages of wet chemical processes.

It is, therefore, an object of this invention to provide a method for developing a photoresist which is more rapid and efficient than the present wet chemical methods.

It is a further object of this invention to provide a dry photoresist development process particularly for the semiconductor industry.

Another object of the invention is to provide a plasma photomask development process.

A further object of the invention is to provide a development process for printed circuit board and photochemical machining applications.

An additional object of the invention is to provide a continuous plasma process for developing photoresist, etching and removing photoresist.

A still additional object of the invention is to provide economical methods for the manufacture of semiconductors which are less hazardous to human health and which contribute less to air pollution than prior art wet chemical processes.

SUMMARY OF THE INVENTION

In accordance with the invention, the developing process includes the key step of following selective exposure of a photoresist layer to radiation with treatment by a gas plasma, such as an oxygen plasma atmosphere, which rapidly removes the undesired photoresist. In the case of a negative resist process the undesired photoresist is the unexposed portions which can be either uncrossed-linked or non-polymerized photoresist. In the case of a positive resist process the undesired photoresist is the exposed portion wherein exposure results in a difference of functional groups or depolymerization. The exposure to the plasma during the developing process must be terminated after a predetermined length of time which is long enough to remove the undesired photoresist but not so long as to remove the desired photoresist. Also, the reactor temperature must be maintained within predetermined limits during development of the photoresist. Other gas plasma operations can be performed after the photoresist development process is complete which includes, for example, etching and photoresist pattern removal.

COMPLETE DESCRIPTION

While the preferred photoresist used in carrying out the invention is an unsaturated aromatic vinyl monomer of the type sold by Horizon Research Corp., Type U-200, other positive or negative photoresists of types well known in the art may be utilized. Suitable other examples of such photoresists include compositions based on polyvinyl cinnamate, polyisoprene, natural rubber resins, formaldehyde novolacs, cinnamylidene, or polyacryllic esters. Examples of these photoresists include a natural rubber resin based composition, a partially cyclized polymer of isoprene, a cinnamylidene or acryllic ester coating composition and poly methylmethacrylate. These photoresists normally contain small amounts of a photoinitiator or a photosensitizer which decomposes under the action of ultraviolet light to yield a free radical species which initiates either the polymerization, depolymerization or functional group transformation reaction. Many photo initiators are well known in the art based on azides, diazo oxides or thioazo compounds, or others such as anthraquinone, benzanthraquinone, etc. The photoresist can be in liquid or dry film form.

Figure 1:
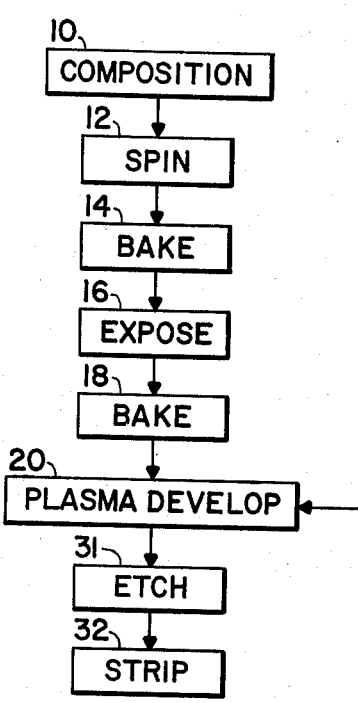
FIG. 1 illustrates the successive operations involved in a process of one embodiment of the invention.
Figure 2:
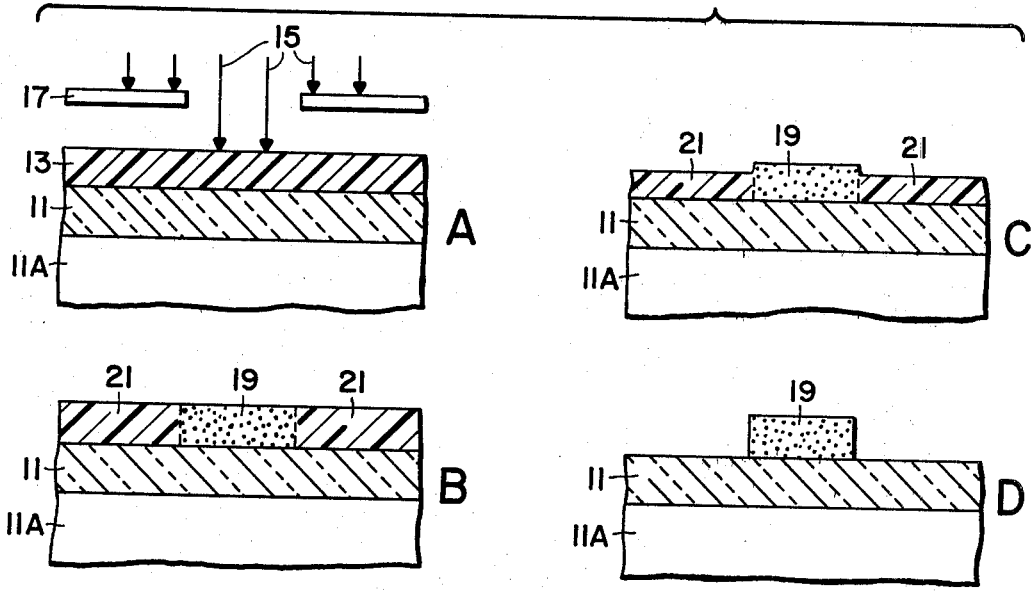
FIG. 2 illustrates the patterning of a negative photoresist layer on a substrate by the development process depicted in FIG. 1.

FIG. 1 shows one sequence of steps utilized in accordance with the present invention. Some of the steps of FIG. 1 are optional and in some cases it will be obvious to one skilled in the art that the order of steps should be changed. FIG. 2 depicts structures useful in understanding the process of FIG. 1. The first step, 10, of the process of FIG. 1 is to prepare or procure the desired photoresist composition. Any of the foregoing photoresist compounds may be coated by conventional means on top of a semiconductor structure, for instance, which is desired to be masked. Typically, photoresist 13 is placed on a silicon dioxide layer 11 located on a silicon substrate 11A, as depicted in FIG. 2A. The coating of photoresist 13 on the wafer may be accomplished by various methods but, preferably, it is done by the spinning method of step 12 wherein the wafer is placed on a vacuum chuck which is then spun, as an eye dropper or mechanical means is utilized to place the photoresist in the center of the wafer. The further spinning of the wafer spreads the photoresist material 13 uniformly over the surface of the wafer.

Following drying of the photoresist, which can be performed by bake step 14, photoresist coating 13 is exposed as indicated by step 16, to radiation 15 of an appropriate wavelength including X-ray or to an electronic or ionic beam through mask 17 to produce the desired pattern therein which includes exposed portion or region 19 and unexposed portions or regions 21, as illustrated in FIG. 2B. A further bake step 18 may be utilized next to produce a difference in thickness between the exposed portion 19 and the unexposed portions 21 as shown in FIG. 2C. This difference in thickness or relief is advantageous in negative resist applications wherein the unexposed regions 21 are to be removed.

The photoresist 13 is now ready for development step 20 by the gas plasma. Oxygen may be used by itself for this purpose or mixed with a diluent type gas such as argon, neon, or helium. Similarly, gases such as water vapor, hydrogen or nitrogen may be used by themselves or with diluent gases. The plasma development can be performed in commercially available plasma equipment.

Typically, the substrate having a photoresist film of between 5,000 angstroms and 30,000 angstroms is placed in a carrier in the preheated chamber of the reactor of the plasma generator equipment in accordance with steps 20A and 20B. The substrate is then heated to a temperature within a predetermined temperature range (50° C. to 300° C.). If the temperature of the wafer is too high or too low, useful development will not occur. If the temperature is too high, photoresist layer 13 tends to degrade. If the temperature is too low the rate of development of photoresist layer 13 is undesirably small. Next, the pressure in the chamber is reduced to a low pressure which can be about 0.025 torr and then oxygen, for instance, is bled into the chamber while the RF generator is turned on to produce the oxygen plasma, in accordance with respective steps 20C and 20D. The oxygen pressure is between 0.05 and 5 torr and the RF forward power is between 5 and 300 watts, typically. The range of flow rates corresponding to the foregoing pressure range has been measured to be from about 0.1 SCCM (standard cubic centimeters per minute) to 500 SCCM. Under these conditions, the negative photoresist is fully developed or removed from the unexposed regions 21 of one substrate, as shown in FIG. 2D, in approximately one to five minutes immediately after which time the process can be stopped in accordance with step 20E. With a positive photoresist, the pattern will be developed in the exposed region.

The temperatures of the photoresist, the substrate and the development time are the most critical parameters of the plasma development and these parameters depend on the type, pattern and amount of photoresist being developed. Reactor RF forward power is generally specified as a function of reactor plate area or chamber volume. The amount of RF forward power affects the concentration of the reactants and the temperature within the reactor chamber.

Figure 3:
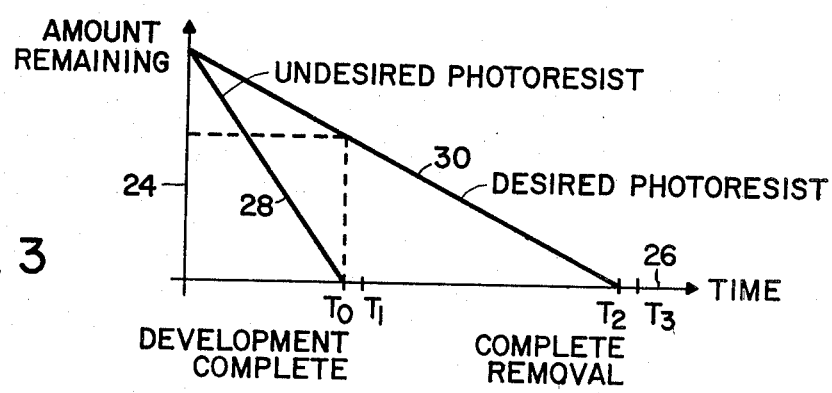
FIG. 3 is a graph showing the differential rates of removal of exposed and unexposed photoresist during a development process in accordance with FIG. 1.

FIG. 3 is graph of the "amounts remaining" of desired and undesired photoresists, which are plotted along ordinate axis 24, with respect to the amount of time of exposure to plasma, which is plotted along abscissa axis 26. In a negative photoresist development application, it is desired that the exposed photoresist remain after development and in a positive photoresist application it is desired that the unexposed photoresist remain after development. The slope of line 28 indicates the rate of removal of undesired photoresist by the gas plasma development process. More specifically, in the case of a negative photoresist application, the slope of line 28 indicates the rate of removal of unexposed photoresist 21 of FIG. 2, for instance. The slope of line 30 indicates the rate of removal of the desired photoresist by the gas plasma development process. Thus, the slope of line 30 indicates the rate of removal of exposed portion 19 of FIG. 2B in response to the plasma development process. Thus, while negative photoresist layer 13 is being developed, unexposed portions 21 are being removed at a faster rate than exposed portion 19. Ideally, line 30 would have a slope approaching zero and line 28 would have a slope approaching infinity.

Consequently, as the development process continues there reaches a point in time, $T_O$, when the undesired photoresist 21 has been completely removed but enough of the desired photoresist 19 still remains to provide a desired masking effect for $SiO_2$ layer 11 as indicated in FIG. 2D. This time is defined by the intersection of line 28 and abscissa 26 of the graph of FIG. 3. Thus, it is generally desired to stop the development process at time, $T_1$, which occurs shortly after the complete removal of the undesired photoresist. Experimental work has shown that the development process of the invention utilizing the aforementioned Horizons' U200 photoresist will resolve lines and spaces down to at least the 100 microinch level. This type of resolution is similar to that produced with the prior art wet chemical photoresist development processes.

Example of Development Process for Photoresist on SiO$_2$

In a typical example of carrying out the development process, the U-200 photoresist was spun on a three inch silicon wafer having a silicon dioxide surface thereon. The wafer was spun at 3000 revolutions per minute for approximately thirty seconds to distribute the photoresist thereon. The photoresist coated wafer was then held at room temperature for ten minutes to allow evaporation of solvents remaining in the photoresist. The wafer was then placed beneath a projection printer and selectively exposed through a mask to ultraviolet radiation. The wafer was again held for two minutes at room temperature and then baked for one minute at approximately 100° C.

The wafer was then placed in the chamber of a Tegal aluminum reactor which has volume of 144 cubic inches and a plate area of 120 square inches and which had been preheated to approximately 100° C. After the wafer reached a temperature of about 100° C., the chamber was evacuated for two minutes to reduce the pressure to about 0.05 torr. Pure oxygen was bled into the reactor chamber to produce a pressure within the chamber of 0.7 Torr while 150 watts of radio frequency forward power was applied to produce the oxygen plasma. The rate of flow was about 68 SCCM. The photoresist coating on one wafer of a thickness of 1 micron was developed in approximately three minutes, at which time the plasma was stopped by simultaneously shutting off the oxygen and the RF power.

By the foregoing, it can be seen that the photoresist exposure and plasma development took approximately five minutes which is in contrast with approximately one-half hour typical for conventional wet process development and hard bake. The "hard bake" step following wet photoresist development for removing volatile chemicals from the photoresist is not required in the foregoing plasma development processes, which does not introduce undesired volatile chemicals into the photoresist.

Oxygen plasma processes, of course, utilize oxygen gas which is inexpensive, readily available and not hazardous to human health. Moreover, oxygen plasma processes utilize only one pound of oxygen to perform the function of approximately 1,000 pounds of xylene. Thus, in terms of time, chemical costs, air pollution and health hazards, oxygen plasma development processes have several advantages over wet chemical developing processes utilizing xylene.

Continuous Plasma Process

After development of the photoresist and without removing the wafer from the reactor chamber the plasma may be changed to a fluorinated hydrocarbon gas to effect an etch of a silicon dioxide or other layer 11 (step 31). Then, still without removing the wafer from the chamber, an oxygen plasma can be again introduced into the reactor chamber to totally strip (step 32) the remaining photoresist.

More specifically, to etch a silicon nitride layer which overlies a silicon dioxide layer, as is often required during the processing of bipolar integrated circuits and discrete devices, the reactor chamber and wafers therein were heated to a temperature between 50 to 100 degrees C., such as 70° C. Next, the pressure in the reactor chamber was pumped down to about 0.025 torr. The plasma was generated from a mixture of about 92% CF$_4$ and 8% O$_2$ which was at a pressure of from 0.1 to 5 torr, such as 0.7 torr, in the reactor chamber. The flow rate at 0.7 torr was about 68 SCCM. The reactor was operated at a power level of between 5 watts to 150 watts, with 50 watts being typical. The silicon nitride film of approximately 800 Angstroms was etched in about five minutes.

If following an etch step for instance, the exposure of a photoresist layer to an oxygen, for instance, plasma is continued after time $T_1$ of FIG. 3, a time $T_2$ will eventually be reached when all of photoresist 13 of FIG. 2 is removed or stripped from the wafer. The stripping process can then be stopped at time $T_3$ which occurs slightly after time $T_2$. As a separate step or together with the stripping step, hydrogen may be introduced to gather inorganic matter not removed by the oxygen plasma.

More specifically, the photoresist was stripped from the silicon nitride layer by first pumping down the reactor chamber to 0.1 torr and then utilizing oxygen at a working pressure of 1 torr. The reactor power was adjusted to approximately 300 watts.

The foregoing continuous dry plasma process saves a considerable amount of handling, labor and time as compared to prior art processes utilizing the dissimilar chemical systems. It is conceivable that the foregoing continuous gas plasma operation can be automated so that the wafers can be automatically developed, etched and cleaned without help from an operator.

Example of Development Process for Photoresist on Metal

While the wafer has been described as having a silicon dioxide or a silicon nitride coating thereon, the above procedures or processes are also usable for treatment of photoresist on a metal layer on a semiconductor material. Also, the substrate need not be a semiconductor material, but could be a photolithographic plate, a printing plate or a printed circuit board, for instance.

More specifically, a photoresist composition obtained by dissolving 3 gm. vinyl carbazole, 1 gm. 2,6 di-tert-butyl cresol, 2 gm. iodoform (CHI$_3$), and 4 gm. polyvinyl butyral (molecular weight—100,000) in 80 gm. n-butyl alcohol and filtering through a 0.9 micron filter was spun on disks of aluminum and on disks of printed circuit board material which was copper coated, in a manner similar to the above described example for development of photoresisted SiO$_2$. Following a brief bake of three minutes at 35° C., the photoresist was selectively exposed through a mask to actinic light and again baked at about 100° C. for five minutes. The pattern fully developed in the photoresist in about three minutes in an oxygen plasma generator which was operated at about the same temperature, pressure and power levels mentioned above for the example for development of photoresist on SiO$_2$.

Example of Photoresist Development Process for Photomask Preparation

The gas plasma development process is also useful for fabrication of photomasks such as those used in the manufacture of semiconductors. A suitable dye such as commercially available Sudan Black can be added to the above described photoresists for the manufacture of organic based or emulsion based glass masks. No dye need be added for patterning chrome or oxide masks. Clear photoresist, or photoresists containing dyes for select color variation to filter out light of a specific wavelength can be applied to a clear glass mask, photopatterned, and then plasma developed to leave photoresist only on selected areas on the surface of the glass.

More specifically, a photoresist formulation such as the previously described formulations was spun on a clear glass plate at 3000 rpm for 40 seconds. Next, the glass plate with the photoresist thereon was baked at 35° C. for 3 minutes. Then the photoresist was selectively exposed through a mask for 30 seconds to ultraviolet radiation having an intensity of 2150 microwatts per centimeter squared. The exposed photoresist was next baked for one minute at 105° C. and developed in a Tegal reactor in accordance with the above-described example for development of photoresist on $SiO_2$.

Example of Photo Imaging

The plasma development process can be used to provide a color change between the exposed and unexposed regions. More specifically, in one experiment a red dye was dissolved in the photoresist of a negative photoresist system. The plasma development was terminated before complete removal of the unexposed resist. The exposed regions of the resist were red in color whereas the partially developed unexposed regions became orange in color. Thus, plasma developing can be utilized to provide multi-color imaging.

What has been described are rapid and efficient methods or processes for developing photoresist. The above-described processes are particularly useful for the fabrication of semiconductor devices. In particular, processes have been described for development of photoresist on silicon dioxide, silicon nitride, metal and photomask materials, and for photo-imaging. In addition, continuous processes have been described relating to the development of photoresist, etching of the layer underlying the photoresist, and stripping of the photoresist. The above described dry plasma processes are believed to be more economical, less hazardous to human health and to contribute less to air pollution than the prior art wet chemical processes.

What is claimed is:

1. In the art of making a resist mask from a patterned resist coating on a substrate wherein said coating has exposed and non-exposed areas corresponding to the pattern for said mask in said coating, the improvement comprising:
   (a) the dry process step of subjecting said coating on said substrate to plasma action to preferentially remove the resist of one of said areas relative to the other area whereby said resist in said one area is removed faster than said resist in the other of said areas; and
   (b) terminating said plasma action when said resist of said one area is removed and said resist of said other area remains and is of a thickness to provide a resist mask function on said substrate.

2. In the art of making a resist mask as defined in claim 1, wherein said coating is a negative resist, and said plasma action removes the unexposed area of said negative resist more rapidly than the exposed area of said negative resist.

3. In the art of making a resist mask as defined in claim 1, wherein said coating is a positive resist, and said plasma action removes the exposed area of said positive resist more rapidly than the unexposed area of said positive resist.

4. In the art of making a resist mask as defined in claim 1 wherein said coating is that of a negative resist and said one area of resist to be removed comprises an uncross-linked resist polymer.

5. In the art of making a resist mask as defined in claim 1, wherein said mask has an uncovered portion at said one area and a covered portion at said other area which are both for subsequent use of such mask, performing a process step through said uncovered portion of said mask and simultaneously limiting the performing of such process step at said covered portion, to thus provide a resist mask function on said substrate.

6. In the art of making a resist mask as defined in claim 5, wherein said substrate has material thereon immediately below said mask, and wherein said process step performed through said uncovered portion of such mask acts on said material to etch the same.

7. In a resist development process for the making of a resist mask wherein a substrate having a resist coating thereon of substantially uniform thickness is subjected to radiation patterning to provide a first area and a second area in said resist coating, the improvement comprising:
   (a) the dry development of said patterned resist coating by subjecting said first and said second areas to dry plasma action which removes the resist coating in one of said areas more rapidly than in the other; and
   (b) terminating said plasma action when the removal of said resist coating in said one area is completed while the resist coating in the other of said areas is of a thickness to perform a resist mask function on said substrate.

8. In the resist development process as defined in claim 7, wherein said resist coated substrate is subjected to dry plasma action in a plasma generator chamber, and wherein said chamber is heated to a predetermined temperature, a predetermined pressure is produced within said chamber for said plasma action, and a predetermined radio frequency power is developed in said chamber for the dry plasma action to which said coating is subjected.

9. In the resist development process as defined in claim 8, wherein said temperature is within the range of 50° C. to 300° C., said pressure is between 0.05 and 5 torr, and said radio frequency power is within the range between 5 and 300 watts.

10. In the process as defined in claim 7, wherein said substrate is that for a semiconductor device and there is material below the resist coating, wherein said dry plasma action is accomplished in a plasma generator chamber, and wherein said one area from which the resist coating is removed is adapted to be subsequently used to treat therethrough the material below said resist coating.

11. In the process as defined in claim 10 wherein said material below said resist coating is silicon dioxide to be subsequently treated through said one area in said resist mask.

12. In the process as defined in claim 7, wherein said substrate is that for a semiconductor device and there is a nitride layer below the resist coating, and wherein said one area from which the resist coating is removed is adapted to be subsequently used to treat therethrough said nitride layer.

13. In the process as defined in claim 7, wherein said substrate is that for a semiconductor device and there is a metal layer below the resist coating, and wherein said one area from which the resist coating is removed is adapted to be subsequently used to treat therethrough said metal layer.

14. In the process as defined in claim 7 wherein said substrate is printed circuit board material and a copper layer is provided on said material having a patterned resist coating thereon, and wherein said patterned resist coating is developed on said copper layer by plasma action as defined in claim 47.

15. In the manufacture of an article with a substrate having a resist coating thereon for the purpose of making therefrom a resist mask with a first area and a second area on said substrate to perform a masking function, said manufacture including:
  (a) the step of effecting a pattern in said resist coating corresponding to the desired configuration for said resist mask and including in said pattern said first and said second areas;
  (b) subjecting said resist coating to plasma action to remove the resist in one of said areas more rapidly than the resist in the other area and provide said one area as a non-covered portion in said coating to accommodate a subsequent process step in said manufacture while said resist coating in said other area comprises a covered portion on said substrate to prevent any action by such subsequent process step at said covered portion; and
  (c) terminating said plasma action after said resist coating in said one of said areas is removed.

16. In the manufacture as defined in claim 15 wherein the article manufactured is a semiconductor device, said coating is a negative resist of a substantially uniform thickness, and said pattern-effecting step comprises exposing said resist to radiation whereby o ne of said areas is exposed and the other area is non-exposed, the step of subjecting said substrate and said exposed negative resist coating thereon to a bake before said plasma action, with said bake step effecting a reduction in the thickness of the coating at said unexposed area relative to the thickness of the coating at said exposed area.

17. In the manufacture of an article as defined in claim 15 wherein said substrate is that for a semiconductor device, and wherein said substrate with said patterned resist coating thereon is placed in plasma generator equipment and said plasma action is one of oxidation of said resist coating.

18. In the manufacture of an article as defined in claim 15 for use in manufacturing a glass mask for a semiconductor manufacturing operation wherein said substrate is glass and said resist coating is on said glass substrate, the step of baking said resist coating on said glass substrate after patterning said resist coating and before subjecting said resist coating to plasma action.

19. In the manufacture of an article as defined in claim 15 wherein a color dye is added to said resist before applying the same as a coating on said substrate for patterning the same by a light source, the step of applying such resist as a coating to said substrate to filter out light of a specific wavelength when said resist coating is exposed to said light source to effect a pattern therein.

20. In the art of fabricating a resist mask for use in the manufacture of a semiconductor device having a semiconductor substrate with a layer of material thereon and a surface on said material, the process steps of:
  (a) applying a resist coating of a substantially uniform thickness to said surface on said semiconductor substrate;
  (b) baking said resist coating on said substrate to dry said coating;
  (c) effecting a desired pattern in said resist coating by a source of radiation and with a first area and a second area in said pattern;
  (d) relief baking said coating to produce a thickness difference in said coating such that the thickness of said coating in one of said areas is less than that in the other of said areas;
  (e) loading said substrate into a plasma generator;
  (f) operating said plasma generator and subjecting said patterned-resist coating to plasma action to develop said resist coating and in doing so to remove the resist of lesser thickness in said one area faster than said resist coating in the other area; and
  (g) terminating said plasma action at a time when said resist in said one area is completely removed, with said resist in said other area at said time being of a thickness to perform a masking function in a subsequent step in the manufacture of a semiconductor device.

21. In the art of fabricating a resist mask from a patterned resist coating on a substrate for use in the manufacture of a semiconductor device wherein exposed and nonexposed areas are created in said resist coating corresponding to the pattern therein for said mask, the improvement comprising:
  (a) placing said substrate in a plasma generator chamber to perform a dry development process on said resist coating;
  (b) heating in said generator chamber said substrate and the coating thereon to a predetermined temperature;
  (c) adjusting pressure in said generator chamber to a predetermined amount;
  (d) introducing a gas into said generator chamber at a predetermined pressure; and
  (e) applying radio frequency power in said generator chamber to produce plasma and to develop said coating with said plasma, said plasma acting to preferentially remove one of said areas of said coating while said other area of said coating is maintained at a thickness to serve as a resist mask on said substrate, and with said preferential removal accomplishing a faster removal of the resist coating in said one area than the removal thereof in said other area.

22. In the art of fabricating a resist mask as defined in claim 21 wherein said predetermined temperature is in the range of 50° C. to 300° C.; said predetermined pressure is below 1 torr; said gas is introduced at a pressure in the range from 0.05 to 5 torr, and said radio frequency power is in the range of 5 to 300 watts.

23. In the art of fabricating a semiconductor device having a substrate which has thereon a silicon dioxide layer beneath a resist mask made in accordance with claim 21, the further improvement comprising;
  (a) maintaining said substrate with said resist mask thereon in said plasma generator chamber after developing said mask, and applying a plasma action to said mask to etch said silicon dioxide layer through said mask at such area where the resist is removed; and
  (b) then further maintaining said substrate in said generator chamber and applying a plasma action thereto to strip said resist mask from said substrate after the use of said mask for said etching.

24. In the art of fabricating a semiconductor device having a substrate which has metal material thereon beneath a resist mask made in accordance with claim 21, the further improvement comprising:
  (a) maintaining said substrate with said resist mask thereon in said generator chamber and subjecting said metal material to plasma action through said mask to etch said metal material; and
  (b) then further maintaining said substrate in said generator chamber and subjecting said resist mask to plasma action to strip said resist mask from said substrate after said mask is used for said etching.

25. In a process for the fabrication of an article having a substrate to be coated with a resist and utilizing plasma in a plasma chamber for performing selected dry processing steps in the course of such fabrication, including the steps of:
  (a) coating a substrate with a resist;
  (b) effecting a pattern in said resist coating on said substrate by means of a radiation source to provide a first area and a second area in said resist coating;
  (c) developing said resist coating by subjecting said resist coating to plasma action in a plasma chamber which removes one of said areas of said resist coating to provide an uncovered area while there is resist coating in the other of said areas on said substrate of a thickness to provide a covered area, with said resist coating in the course of said developing being removed faster in said one area than in said other area in the same period of time;
  (d) thereafter performing an etching step by plasma action in said plasma chamber on said substrate in said uncovered area of said resist coating while preventing etching at said covered area of said resist coating; and
  (e) thereafter performing a stripping step by plasma action in said plasma chamber to remove said resist remaining on said substrate; with said developing, said etching and said stripping as said three defined process steps being performed sequentially in said plasma chamber without removing said substrate therefrom during such three step sequence.

26. In the art of resist technology wherein a coating of resist is applied to a substrate having material below said coating, the processing of said resist for the purpose of making a resist mask on said substrate, then using said resist mask, and thereafter removing said resist mask from said substrate, the steps for accomplishing said purpose comprising:
  (a) applying as a coating a substantially uniform layer of resist to material on said substrate;
  (b) effecting a pattern in said layer of resist to provide a first area and a second area in said resist;
  (c) subjecting said substrate with said resist layer thereon to dry plasma action in equipment for developing said resist layer whereby to remove the resist from one of said areas faster than from said other area, and stopping said plasma action after the resist in said one of said areas is completely removed and resist in said other area remains to serve as a mask on said substrate;
  (d) maintaining said substrate with said patterned resist mask thereon in said equipment to be subjected to further plasma action therein and treating said material on said substrate through said one area of said resist mask to plasma action; and
  (e) thereafter maintaining said substrate with said patterned resist mask thereon in said equipment and subjecting the same to still further plasma action to strip said resist mask from said substrate after it is used for said treating.

* * * * *